United States Patent
Chiyonaga et al.

(10) Patent No.: US 8,609,992 B2
(45) Date of Patent: Dec. 17, 2013

(54) CIRCUIT BOARD, MANUFACTURING METHOD OF CIRCUIT BOARD, SUSPENSION SUBSTRATE, SUSPENSION, DEVICE-MOUNTED SUSPENSION, AND HARD DISK DRIVE

(75) Inventors: Junichi Chiyonaga, Tokyo-to (JP); Hiromichi Takatsu, Tokyo-to (JP); Yoichi Miura, Tokyo-to (JP); Yoichi Nagai, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 13/511,793

(22) PCT Filed: Dec. 24, 2010

(86) PCT No.: PCT/JP2010/073416
§ 371 (c)(1),
(2), (4) Date: May 24, 2012

(87) PCT Pub. No.: WO2011/078355
PCT Pub. Date: Jun. 30, 2011

(65) Prior Publication Data
US 2012/0241200 A1  Sep. 27, 2012

(30) Foreign Application Priority Data
Dec. 24, 2009  (JP) ................................. 2009-292383

(51) Int. Cl.
*H05K 1/00*  (2006.01)
(52) U.S. Cl.
USPC ..................... 174/254; 360/245.8; 360/245.3; 360/246; 360/245.9; 174/255
(58) Field of Classification Search
USPC ........... 360/245.8, 245.9, 245, 294, 246, 244, 360/240, 266.3, 245.3; 428/810
See application file for complete search history.

(56) References Cited

U.S. PATENT DOCUMENTS

| | | | |
|---|---|---|---|
| 5,463,513 A * | 10/1995 | Hoshino | 360/246.6 |
| 5,973,882 A | 10/1999 | Tangren | |
| 5,986,853 A * | 11/1999 | Simmons et al. | 360/245.9 |
| 6,163,438 A | 12/2000 | Kajitani | |
| 2002/0141117 A1 * | 10/2002 | Kasajima et al. | 360/294.4 |
| 2009/0310260 A1 | 12/2009 | Miyazawa et al. | |
| 2009/0310909 A1 | 12/2009 | Ishii et al. | |

FOREIGN PATENT DOCUMENTS

| | | |
|---|---|---|
| CN | 1114769 A | 1/1996 |
| CN | 101479799 A | 7/2009 |

(Continued)

OTHER PUBLICATIONS

International Search Report; mailed Feb. 15, 2011; PCT/JP2010/073416.

*Primary Examiner* — Tuan T Dinh
*Assistant Examiner* — Steven Sawyer
(74) *Attorney, Agent, or Firm* — Ladas & Parry LLP

(57) ABSTRACT

The problem of the present invention is to provide a circuit board comprising a shape retention unit capable of thinning while maintaining mechanical strength. The present invention solves the above-mentioned problem by providing a circuit board comprising a metal supporting substrate, a first insulating layer formed on the above-mentioned metal supporting substrate, and a wiring layer formed on the above-mentioned first insulating layer, wherein an open area is formed in the above-mentioned metal supporting substrate, and the circuit board comprises a shape retention unit having a second insulating layer contacting with the above-mentioned metal supporting substrate and a reinforcing layer formed on the above-mentioned second insulating layer, and bridging the above-mentioned metal supporting substrate divided by the above-mentioned open area.

19 Claims, 6 Drawing Sheets

(56) References Cited

FOREIGN PATENT DOCUMENTS

| | | |
|---|---|---|
| CN | 101604532 A | 12/2009 |
| JP | 09-134514 A | 5/1997 |
| JP | 10-069746 A | 3/1998 |
| JP | 11-213589 A | 8/1999 |
| JP | 3248786 B2 | 11/2001 |
| JP | 2008-152813 A | 7/2008 |
| JP | 4165789 B2 | 8/2008 |

* cited by examiner

CIRCUIT BOARD, MANUFACTURING METHOD OF CIRCUIT BOARD, SUSPENSION SUBSTRATE, SUSPENSION, DEVICE-MOUNTED SUSPENSION, AND HARD DISK DRIVE

TECHNICAL FIELD

The present invention relates to a circuit board comprising a shape retention unit capable of thinning while maintaining mechanical strength.

BACKGROUND ART

For example, a suspension substrate mounted with a device such as a magnetic head slider is known as a circuit board used for an HDD (a hard disk drive). The suspension substrate ordinarily has a fundamental structure such that a metal supporting substrate (such as SUS), an insulating layer (such as a polyimide resin) and a wiring layer (such as Cu) are laminated in this order; and ordinarily has, at one tip, a device mounting area which is mounted with the device, and has, at the other tip, a connecting area for connecting with another circuit board.

Also, it is known that the metal supporting substrate is typically so high in rigidity that part of the metal supporting substrate is removed for intending to achieve lower rigidity. On the other hand, the removal of part of the metal supporting substrate occasionally causes a problem resulting from lack of mechanical strength by contraries. Thus, a technique for reinforcing the metal supporting substrate by using an insulating material is known. For example, in Patent Literature 1, a suspension assembly having a specific dielectric limiter is disclosed. This technique relates to a limiter for preventing a flexure assembly from plastically deforming and being incapable of pivoting in a predetermined manner in the case where acceleration is applied to a head/slider of an HGA (a head gimbal assembly) by impact force and the flexure assembly for supporting the head/slider is displaced over a certain level, and relates to a dielectric limiter suitable for downsizing. The plastic deformation of the suspension assembly is occasionally caused resulting from not merely the impact on a magnetic disk device but also the handling of the HGA in a manufacturing process. However, in order to restrain such deformation of the dielectric limiter itself, the width of the limiter needs to be maintained at a predetermined size, whereby a problem that thinning is difficult occurs.

Also, the following technique is known as a technique for processing a polyimide resin used for an insulating layer. For example, in Patent Literature 2, it is described that a resist image for processing an insulating layer is formed to process the insulating layer by wet etching in accordance with the resist image. Also, in Patent Literature 3, it is described that only an area to be removed in a polyimide resin with a faster dissolution rate is selectively removed by the same etching solution while using polyimide resins different in dissolution rate.

CITATION LIST

Patent Literature

Patent Literature 1: Japanese Patent Application Publication Laid-Open No. 2008-152813
Patent Literature 2: Japanese Patent No. 4,165,789
Patent Literature 3: Japanese Patent No. 3,248,786

SUMMARY OF INVENTION

Technical Problem

The present invention has been made in view of the above-mentioned problems, and the main object thereof is to provide a circuit board comprising a shape retention unit capable of thinning while maintaining mechanical strength.

Solution to Problem

In order to solve the above-mentioned problems, the present invention provides a circuit board comprising a metal supporting substrate, a first insulating layer formed on the above-mentioned metal supporting substrate, and a wiring layer formed on the above-mentioned first insulating layer, wherein an open area is formed in the above-mentioned metal supporting substrate, and the circuit board comprises a shape retention unit having a second insulating layer contacting with the above-mentioned metal supporting substrate and a reinforcing layer formed on the above-mentioned second insulating layer, and bridging the above-mentioned metal supporting substrate divided by the above-mentioned open area.

According to the present invention, the width of the shape retention unit may be narrowed while maintaining mechanical strength for the reason that the shape retention unit has the second insulating layer and the reinforcing layer.

In the present invention, one of the above-mentioned metal supporting substrates divided by the above-mentioned open area is preferably a movable area which is movable in the thickness direction of the above-mentioned circuit board. The reason therefor is that the shape retention effect of the shape retention unit is easily performed.

In the present invention, a material of the above-mentioned second insulating layer is preferably the same as that of the above-mentioned first insulating layer. The reason therefor is to allow the second insulating layer to be formed simultaneously with the formation of the first insulating layer.

In the present invention, a material of the above-mentioned second insulating layer is preferably a polyimide resin. The reason therefor is that it is excellent in insulating properties and processability.

In the present invention, it is preferable to further have a cover layer for covering the above-mentioned wiring layer. The reason therefor is to allow the wiring layer to be restrained from deteriorating.

In the present invention, a material of the above-mentioned reinforcing layer is preferably the same as that of the above-mentioned cover layer. The reason therefor is to allow the reinforcing layer to be formed simultaneously with the formation of the cover layer.

In the present invention, the thickness of the above-mentioned reinforcing layer is preferably thicker than the thickness of the above-mentioned cover layer on the above-mentioned wiring layer. The reason therefor is that the shape retention unit may be reinforced while enhancing weight reduction by thickening only the thickness of the reinforcing layer without thickening the thickness of the cover layer on the wiring layer more than necessary.

In the present invention, a material of the above-mentioned reinforcing layer is preferably a polyimide resin.

In the present invention, a material of the above-mentioned reinforcing layer is preferably the same as that of the above-mentioned wiring layer. The reason therefor is to allow the reinforcing layer to be formed simultaneously with the formation of the wiring layer.

In the present invention, a material of the above-mentioned reinforcing layer is preferably copper.

In the present invention, the above-mentioned reinforcing layer is preferably formed on the whole surface of the above-mentioned second insulating layer.

Also, the present invention provides a manufacturing method of a circuit board, comprising steps of: a laminated body forming step of forming a laminated body comprising a first metal layer, an insulating layer formed on the above-mentioned first metal layer, and a reinforcing layer and a wiring layer formed on the above-mentioned insulating layer; an insulating layer etching step of forming a second insulating layer for supporting the above-mentioned reinforcing layer and a first insulating layer for supporting the above-mentioned wiring layer by etching the insulating layer of the above-mentioned laminated body; and a metal layer etching step of forming a metal supporting substrate having an open area by etching the above-mentioned first metal layer after above-mentioned insulating layer etching step, and thereby forming a shape retention unit having the above-mentioned second insulating layer and the above-mentioned reinforcing layer, and bridging the above-mentioned metal supporting substrate divided by the above-mentioned open area.

According to the present invention, the formation of the shape retention unit allows a circuit board to be excellent in form stability.

In the present invention, the above-mentioned reinforcing layer is preferably used as a resist layer in the above-mentioned insulating layer etching step. The reason therefor is that the reinforcing layer may be used as the resist layer and no resist layer needs to be separately provided.

In the present invention, a material of the above-mentioned reinforcing layer is preferably a material with a lower etching rate than a material of the above-mentioned insulating layer. The reason therefor is that in etching the insulating layer, the reinforcing layer may be used as the resist layer and the shape retention unit may be easily formed.

In the present invention, a material of the above-mentioned reinforcing layer is preferably a polyimide resin or copper.

In the present invention, a material of the above-mentioned insulating layer is preferably a polyimide resin.

In the present invention, a removing step of removing the above-mentioned reinforcing layer may be performed after the above-mentioned metal layer etching step. For example, in the case where the reinforcing layer is a metal layer and mechanical strength of the shape retention unit becomes so strong as to restrict a predetermined movement of a movable section of the metal supporting substrate more than necessary, the reinforcing layer is removed to allow flexibility of the shape retention unit to be improved.

Also, the present invention provides a suspension substrate which is the above-mentioned circuit board.

According to the present invention, the use of the above-mentioned circuit board may provide a suspension substrate excellent in form stability.

Also, the present invention provides a suspension comprising the above-mentioned suspension substrate.

According to the present invention, the use of the above-mentioned suspension substrate may provide a suspension excellent in form stability.

Also, the present invention provides a device-mounted suspension comprising the above-mentioned suspension and a device mounted on a device mounting area of the above-mentioned suspension.

According to the present invention, the use of the above-mentioned suspension may provide a suspension excellent in form stability.

Also, the present invention provides a hard disk drive comprising the above-mentioned device-mounted suspension.

According to the present invention, the use of the above-mentioned device-mounted suspension allows for a highly functionalized hard disk drive.

ADVANTAGEOUS EFFECTS OF INVENTION

The present invention produces the effect such as to allow a circuit board comprising a shape retention unit capable of thinning while maintaining mechanical strength to be provided.

DESCRIPTION OF EMBODIMENTS

A circuit board, a manufacturing method of a circuit board, a suspension substrate, a suspension, a device-mounted suspension and a hard disk drive of the present invention are hereinafter described in detail.

A. Circuit Board

A circuit board of the present invention is first described. The circuit board of the present invention is a circuit board comprising a metal supporting substrate, a first insulating layer formed on the above-mentioned metal supporting substrate, and a wiring layer formed on the above-mentioned first insulating layer, wherein an open area is formed in the above-mentioned metal supporting substrate, and the circuit board comprises a shape retention unit having a second insulating layer contacting with the above-mentioned metal supporting substrate and a reinforcing layer formed on the above-mentioned second insulating layer, and bridging the above-mentioned metal supporting substrate divided by the above-mentioned open area.

Figure 1A:
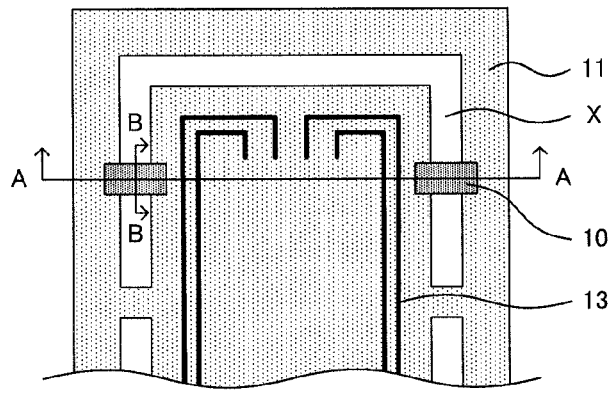
FIGS. 1A to 1C are each an explanatory view showing an example of a circuit board of the present invention.
Figure 1B:
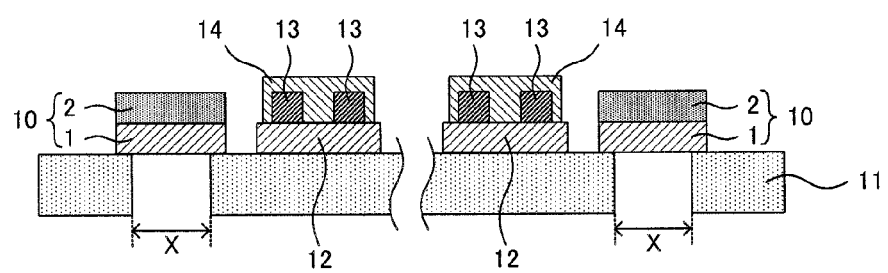
Figure 1C:
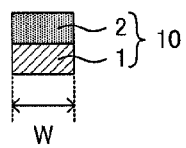

FIGS. 1A to 1C are each an explanatory view showing an example of a circuit board of the present invention. FIG. 1A is a schematic plan view showing an example of a circuit board of the present invention, and the description of the first insulating layer and a cover layer is omitted for convenience. FIGS. 1B and 1C are an A-A cross-sectional view and a B-B cross-sectional view of FIG. 1A, respectively. The circuit board shown in FIG. 1A comprises a metal supporting substrate 11, a first insulating layer (not shown in the drawing) formed on the metal supporting substrate 11, and a wiring layer 13 formed on the first insulating layer. In addition, an open area X is formed in the metal supporting substrate 11, and a shape retention unit 10 bridging the metal supporting substrate 11 divided by the open area X is formed. Also, as shown in FIG. 1B, the shape retention unit 10 has a second insulating layer 1 contacting with the metal supporting substrate 11 and a reinforcing layer 2 formed on the second insulating layer 1. The wiring layer 13 shown in FIG. 1B is formed on the first insulating layer 12 and covered with a cover layer 14.

Thus, according to the present invention, the width (width W in FIG. 10) of the shape retention unit maybe narrowed while maintaining mechanical strength for the reason that the shape retention unit has the second insulating layer and the reinforcing layer. Thus, space saving of the shape retention unit maybe enhanced and design freedom thereof may be improved.

In addition, since the shape retention unit in the present invention has sufficient mechanical strength even though the width thereof is small, the shape retention unit may be prevented from deforming in manufacturing the circuit board. Also, according to the present invention, a shape of the circuit board in the plane direction (xy direction in the case where the thickness direction is regarded as z direction) may be particularly stabilized by providing the shape retention unit. As a result, the deformation of the circuit board in the xy direction may be restrained to allow the circuit board to be excellent in form stability.

The circuit board of the present invention is hereinafter described while dividing into a member of the circuit board and a constitution of the circuit board.

1. Member of Circuit Board

The member of the circuit board of the present invention is first described. The circuit board of the present invention has at least a metal supporting substrate, a wiring layer, a first insulating layer and a shape retention unit.

The metal supporting substrate in the present invention is ordinarily used as a supporting substrate of the circuit board. A material of the metal supporting substrate is not particularly limited but properly selected in accordance with kinds of the circuit board, and is preferably a metal having a spring property. The reason therefor is to allow a circuit board useful as a suspension substrate. Examples of the material of the metal supporting substrate include SUS. The thickness of the metal supporting substrate varies with kinds of the material therefor and is within a range of 10 µm to 20 µm, for example.

The wiring layer in the present invention is ordinarily used as wiring of the circuit board. A material of the wiring layer is not particularly limited but properly selected in accordance with kinds of the circuit board, and is preferably a material having electrical conductivity. The reason therefor is to allow a circuit board useful as a suspension substrate. Examples of a material of the wiring layer include copper (Cu). The thickness of the wiring layer is preferably within a range of 5 µm to 18 µm, for example, and within a range of 9 µm to 12 µm, above all. Also, a gold plating layer may be formed on the surface of the wiring layer. The reason therefor is to allow the wiring layer to be restrained from deteriorating. The thickness of the gold plating layer is within a range of 0.1 µm to 4.0 µm, for example. An Ni plating layer may be formed between the wiring layer and the gold plating layer.

The first insulating layer in the present invention is a layer formed on the metal supporting substrate, and ordinarily insulates the metal supporting substrate from the wiring layer. Examples of a material of the first insulating layer include a polyimide resin (PI). The material of the first insulating layer maybe a photosensitive material or a non-photosensitive material. The thickness of the first insulating layer is within a range of 5 µm to 10 µm, for example.

Also, the circuit board of the present invention may have a cover layer for covering the wiring layer. The wiring layer may be restrained from deteriorating by providing the cover layer. Examples of a material of the cover layer include a polyimide resin (PI). The material of the cover layer may be a photosensitive material or a non-photosensitive material. The thickness of the cover layer on the wiring layer (on the upper face of the wiring layer) is, for example, within a range of 2 µm to 30 µm, preferably, above all, within a range of 2 µm to 20 µm, and more preferably within a range of 2 µm to 15 µm.

The shape retention unit in the present invention has a second insulating layer contacting with the metal supporting substrate and a reinforcing layer formed on the above-mentioned second insulating layer. A material of the second insulating layer is not particularly limited as long as it has desired insulating properties, and is preferably the same as a material of the first insulating layer. The reason therefor is to allow the second insulating layer to be formed simultaneously with the formation of the first insulating layer. In particular, a material of the second insulating layer is preferably a polyimide resin. The reason therefor is that a polyimide resin is excellent in insulating properties and processability. The thickness of the second insulating layer is, for example, within a range of 5 µm to 10 µm.

The above-mentioned reinforcing layer is formed on the second insulating layer, and is not particularly limited as long as it improves mechanical strength of the second insulating layer. Ordinarily, the thickness of the shape retention unit is thickened by providing the reinforcing layer and mechanical strength of the second insulating layer is improved. Examples of the reinforcing layer include metal and a resin.

A material of the reinforcing layer is preferably a material with a lower etching rate than a material of the first insulating layer. As described later, the reason therefor is that in etching the insulating layer, the reinforcing layer may be used as a resist layer and the shape retention unit may be easily formed. Also, a material of the reinforcing layer is preferably a material with high adhesion properties to the first insulating layer. The reason therefor is to allow the shape retention unit with a narrower width to be formed. This effect is described in detail in the later-mentioned FIGS. 8A and 8B.

Also, a material of the reinforcing layer is preferably the same as that of the cover layer. The reason therefor is to allow the reinforcing layer to be formed simultaneously with the formation of the cover layer. Specific examples of the reinforcing layer include a polyimide resin. Above all, in the present invention, a material of the second insulating layer and the reinforcing layer is preferably a polyimide resin. The reason therefor is that the use of the same polyimide-based material allows the reinforcing layer excellent in adhesion properties to be formed and allows the shape retention unit with a narrow width to be formed. In particular, in the present invention, it is preferable that a material of the second insulating layer and the reinforcing layer is a polyimide resin and an etching rate of a polyimide resin used for the reinforcing layer is smaller than that of a polyimide resin used for the second insulating layer. The reason therefor is that in etching the first insulating layer, the reinforcing layer may be used as a resist layer and the shape retention unit may be easily formed.

Also, a material of the reinforcing layer is preferably the same as that of the wiring layer. The reason therefor is to allow the reinforcing layer to be formed simultaneously with the formation of the wiring layer. Specific examples of the reinforcing layer include copper. Above all, in the present invention, it is preferable that a material of the second insulating layer be a polyimide resin and a material of the reinforcing layer be copper. The reason therefor is that a polyimide resin and copper are excellent in adhesion properties so as to allow the shape retention unit with a narrow width to be formed. In the case where it is a metal, ordinarily, the reinforcing layer is not etched by an etching solution for polyimide resin, so that the reinforcing layer may be used as a resist layer and the shape retention unit may easily be formed. Also, in the case where it is a metal, the reinforcing layer may be covered with the above-mentioned gold plating layer, Ni plating layer and cover layer, etc. in order to prevent deterioration. Also, in this case, a metal thin film layer for improving adhesion properties may be formed between the second insulating layer and the metal of the reinforcing layer.

The thickness of the reinforcing layer is not particularly limited as long as it improves mechanical strength of the second insulating layer. As described above, in the case where it is formed simultaneously with the cover layer or the wiring layer, the reinforcing layer is occasionally the same in thickness as these layers. Also, in the case of using the reinforcing layer as a resist layer, such thickness as to function as a resist layer is necessary. The thickness of the reinforcing layer varies with kinds of the reinforcing layer, and is, for example, within a range of 2 µm to 30 µm, preferably within a range of 4 µm to 20 µm, and more preferably within a range of 4 µm to 15 µm.

In the case where a material of the reinforcing layer is the same as that of the cover layer, the thickness of the reinforcing layer is preferably thicker than the thickness of the cover layer on the wiring layer (on the upper face of the wiring layer). Specifically, as shown in the later-mentioned FIG. 4E, the thickness of the reinforcing layer 2 is preferably thicker than the thickness of the cover layer 14 over the wiring layer 13. The reason therefor is that the shape retention unit may be reinforced while enhancing weight reduction by thickening only the thickness of the reinforcing layer without thickening the thickness of the cover layer on the wiring layer more than necessary. A difference (A-B) between the thickness (A) of the reinforcing layer and the thickness (B) of the cover layer on the wiring layer is, for example, preferably 2 µm or more, and more preferably within a range of 2 µm to 6 µm.

2. Constitution of Circuit Board

Next, the constitution of the circuit board of the present invention is described. An open area (an open area X in FIG. 1A) is formed in the metal supporting substrate used for the circuit board of the present invention. The term 'an open area' in the present invention signifies an area in which the metal supporting substrate is absent, such as an area in which part of the metal supporting substrate is removed. The open area in the present invention may be an area completely surrounded by the metal supporting substrate, or an area part of which is open.

In the present invention, one of the metal supporting substrates divided by the open area is preferably a movable area.

The reason therefor is that the shape retention effect of the shape retention unit is easily performed. In addition, this movable area is preferably an area which is movable in the thickness direction of the circuit board (the thickness direction in FIG. 1B). The movable area which is movable in the thickness direction (z direction) is relatively subject to displacement in the plane direction (xy direction) due to securing movement in the z direction. Thus, the installation of the shape retention unit allows the shape in the xy direction to be particularly retained and stabilized, and allows the circuit board to be restrained from deforming in the xy direction. Examples of such a movable area include a device mounting area mounted with the device.

Next, the shape retention unit in the present invention is described. The shape retention unit in the present invention bridges the metal supporting substrate divided by the open area. The width of the shape retention unit is not particularly limited but is preferably smaller. The reason therefor is that space saving of the shape retention unit may be enhanced and design freedom thereof may be improved. Here, as shown in FIG. 1C, in the case where the width at the bottom of the second insulating layer 1 in the shape retention unit 10 is regarded as W, W is preferably 100 µm or less, more preferably 70 µm or less, and far more preferably 50 µm or less. The reason therefor is that if the value of W is too large, sufficient space saving may not be achieved. On the other hand, W is preferably 30 µm or more, and more preferably 45 µm or more. The reason therefor is that if the value of W is too small, there is a possibility that it is difficult to retain the reinforcing layer. Also, the second insulating layer in the present invention preferably has the later-mentioned taper angle.

Figure 2:
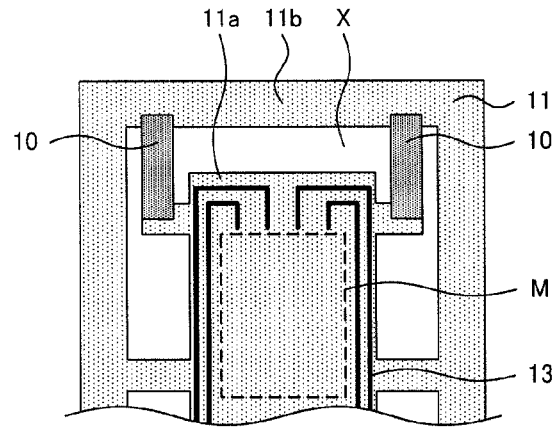
FIG. 2 is a schematic plan view explaining a position of a shape retention unit in the present invention.

The position in which the shape retention unit in the present invention is formed is not particularly limited. For example, as shown in FIG. 2, one of the metal supporting substrates 11 divided by the open area X is a metal supporting substrate 11a having a device mounting area M, the other of the metal supporting substrates 11 divided by the open area X is a metal supporting substrate 11b as an outer frame, and the shape retention unit 10 may be provided so as to bridge these metal supporting substrates.

Figure 3A:
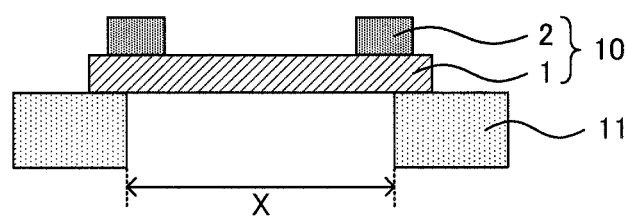
FIGS. 3A to 3C are each a schematic cross-sectional view explaining a constitution of a shape retention unit in the present invention.
Figure 3B:
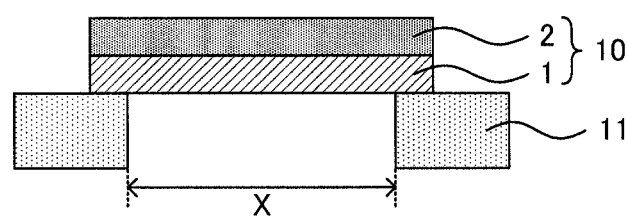
Figure 3C:
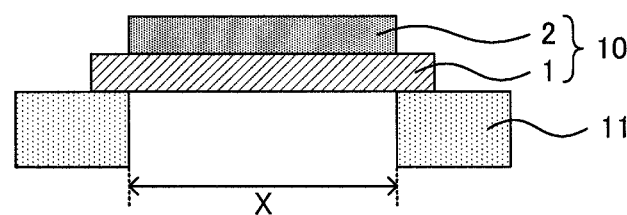

Also, in the present invention, the reinforcing layer may be formed on at least part of the second insulating layer. Above all, in the present invention, the reinforcing layer is preferably formed so as to cover the boundary between the open area and the metal supporting substrate. The reason therefor is that it is a portion in which deformation (such as creases) of the shape retention unit is easily caused. As shown in FIG. 3A, specific examples thereof include the case where the reinforcing layer 2 is formed on the second insulating layer 1 so as to cover the boundary between the open area X and the metal supporting substrate 11. In this case, when formed so as to cover the boundary between the open area X and the metal supporting substrate 11, the reinforcing layer 2 may be separately formed as shown in FIG. 3A, or integrally formed so as to bridge the gap. Also, in the present invention, as shown in FIG. 3B, the reinforcing layer 2 may be formed on the whole surface of the second insulating layer 1. The formation of the reinforcing layer 2 on the whole surface brings the advantage of increasing strength of the whole shape retention unit to allow cutting in the middle portion thereof to be prevented. As shown in FIG. 3B, 'the whole surface' herein is a conception including not merely the case where the end of the reinforcing layer 2 corresponds to the end of the second insulating layer 1 but also the case where the end of the reinforcing layer 2 is different from the end of the second insulating layer 1 by a range of 5 μm or less. For example, even the case where the end of the reinforcing layer 2 is located somewhat inside the end of the second insulating layer 1 may be caused due to an alignment error in manufacturing, and even such a state corresponds to the above-mentioned 'the whole surface'. On the other hand, in the present invention, as shown in FIG. 3C, the reinforcing layer 2 maybe formed only on the second insulating layer 1 in the open area X.

In the present invention, the installation of the reinforcing layer on the second insulating layer improves strength of the second insulating layer to restrain the shape retention unit from deforming; for example, in the case where the shape retention unit is only composed of the second insulating layer (in the case where the shape retention unit does not have the reinforcing layer), it is assumed that the shape retention unit may be restrained from deforming similarly to the case of providing the reinforcing layer by locally thickening the thickness of the second insulating layer in the boundary between the open area and the metal supporting substrate, or by locally widening the width of the second insulating layer. The shape of the shape retention unit in the present invention is not limited to a rectilinear shape as shown in FIGS. 1 and 2 but may adopt optional shapes such as a curvilinear shape and a crimped shape. In particular, the shape of the shape retention unit is preferably determined at a shape according to the function as a limiter.

3. Circuit Board

The circuit board of the present invention has the above-mentioned member and constitution. As described above, the circuit board of the present invention may further have the device mounting area. Examples of a device mounted on the device mounting area include a magnetic head slider, an actuator, and a semiconductor. Also, the above-mentioned actuator may be one such as to have a magnetic head or not to have a magnetic head.

The circuit board of the present invention is preferably a flexible board having flexibility. Also, specific examples of uses of the circuit board include a suspension substrate (flexure) used for an HDD, etc., a semiconductor package substrate and a flexible printed board.

B. Manufacturing Method of Circuit Board

Next, a manufacturing method of a circuit board of the present invention is described. The manufacturing method of a circuit board of the present invention comprises steps of: a laminated body forming step of forming a laminated body comprising a first metal layer, an insulating layer formed on the above-mentioned first metal layer, and a reinforcing layer and a wiring layer formed on the above-mentioned insulating layer; an insulating layer etching step of forming a second insulating layer for supporting the above-mentioned reinforcing layer and a first insulating layer for supporting the above-mentioned wiring layer by etching the insulating layer of the above-mentioned laminated body; and a metal layer etching step of forming a metal supporting substrate having an open area by etching the above-mentioned first metal layer after above-mentioned insulating layer etching step, and thereby forming a shape retention unit having the above-mentioned second insulating layer and the above-mentioned reinforcing layer, and bridging the above-mentioned metal supporting substrate divided by the above-mentioned open area.

Figure 4A:
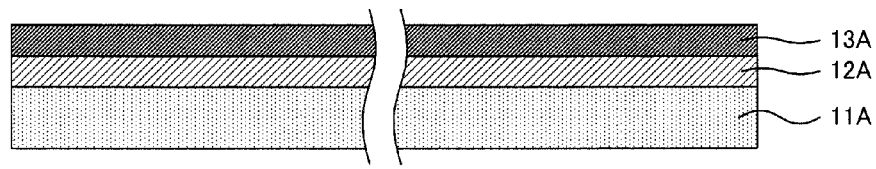
FIGS. 4A to 4E are a schematic cross-sectional view showing an example of a manufacturing method of a circuit board of the present invention.
Figure 4B:
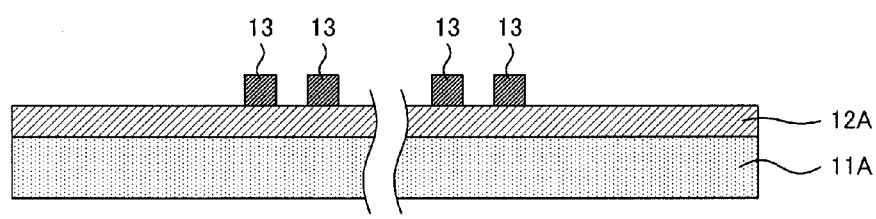
Figure 4C:
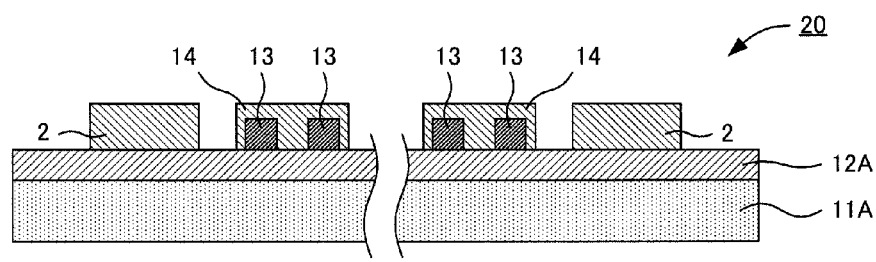

FIGS. 4A to 4E are each a schematic cross-sectional view showing an example of the manufacturing method of a circuit board of the present invention. FIGS. 4A to 4E are an aspect such that a material of the reinforcing layer is the same as that of the cover layer. In FIGS. 4A to 4E, a laminate member having a first metal layer 11A, an insulating layer 12A, and a second metal layer 13A is first prepared (FIG. 4A). Next, the second metal layer 13A is patterned by wet etching to form a wiring layer 13 (FIG. 4B). Next, a cover layer 14 is formed so as to cover the wiring layer 13, and a reinforcing layer 2 is simultaneously formed to obtain a laminated body 20 (FIG. 4C). A relation in thickness between the cover layer 14 and the reinforcing layer 2 in FIG. 4C is merely an exemplification and not particularly limited.

Figure 4D:
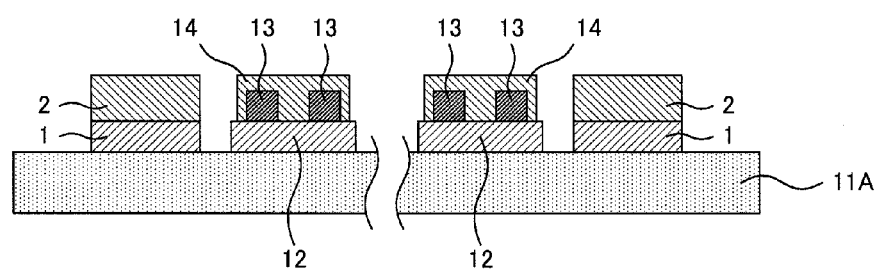

Next, in the case where an etching rate in the cover layer 14 and the reinforcing layer 2 is sufficiently smaller than an etching rate in the insulating layer 12A, the insulating layer 12A may be etched while using the cover layer 14 and the reinforcing layer 2 as a resist layer. Thus, a second insulating layer 1 for supporting the reinforcing layer 2 and a first insulating layer 12 for supporting the wiring layer 13 are formed (FIG. 4D). In the case where an etching rate in the cover layer 14 and the reinforcing layer 2 is not sufficiently smaller than an etching rate in the insulating layer 12A, the insulating layer 12A may be etched through a patterned DFR (dry film resist) layer.

Figure 4E:
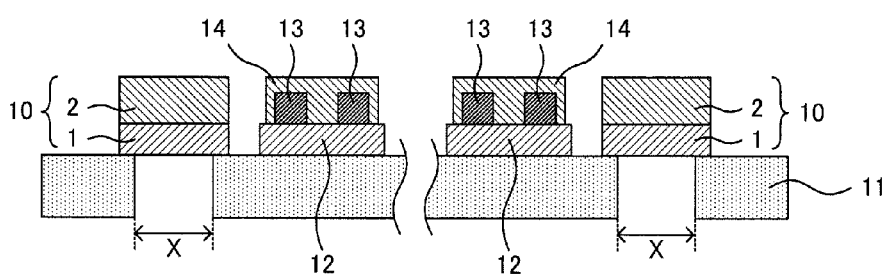

Lastly, a metal supporting substrate 11 having an open area X is formed by etching the first metal layer 11A to thereby form a shape retention unit 10 having the second insulating layer 1 and the reinforcing layer 2 and bridging the metal supporting substrate 11 divided by the open area X, and then obtain a circuit board (FIG. 4E).

As described above, in the present invention, the metal supporting substrate 11 is formed by etching the first metal layer 11A, the first insulating layer 12 and the second insulating layer 1 are formed by etching the insulating layer 12A, and the wiring layer 13 is formed by etching the second metal layer 13A.

Figure 5A:
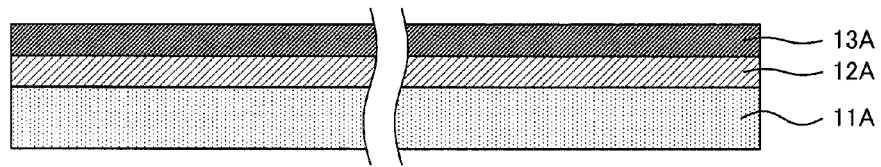
FIGS. 5A to 5E are a schematic cross-sectional view showing another example of a manufacturing method of a circuit board of the present invention.
Figure 5B:
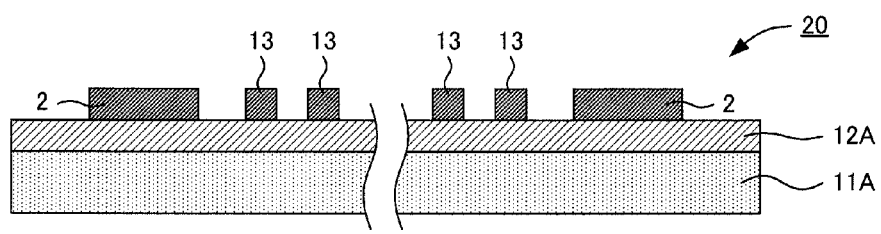
Figure 5C:
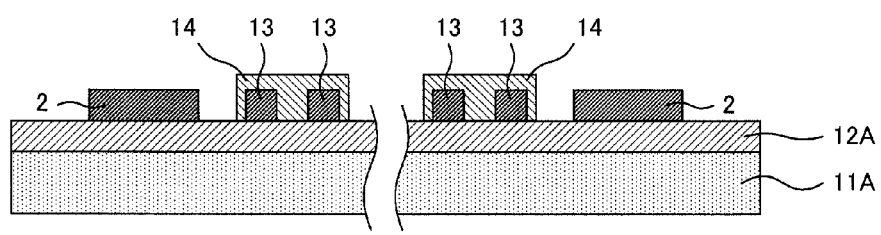
Figure 5D:
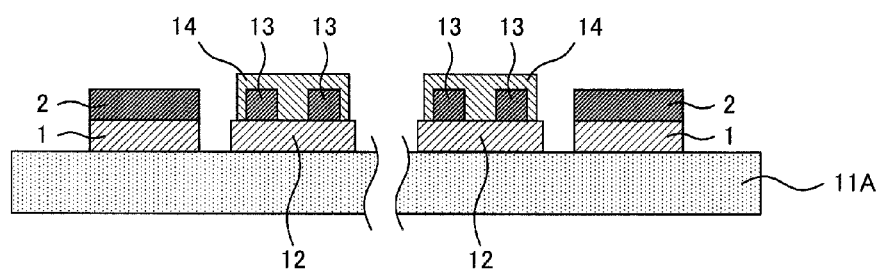
Figure 5E:
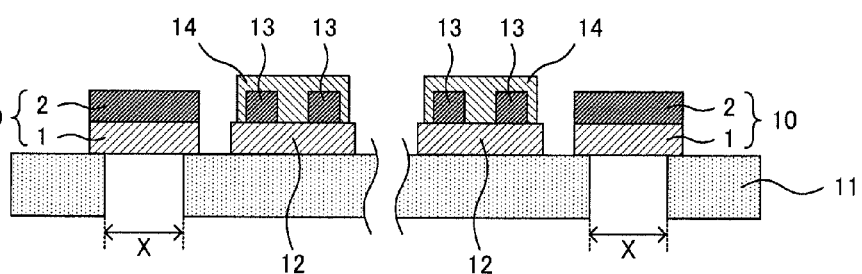

Meanwhile, FIGS. 5A to 5E are a schematic cross-sectional view showing another example of the manufacturing method of a circuit board of the present invention. FIGS. 5A to 5E are an embodiment such that a material of the reinforcing layer is the same as that of the wiring layer. Also, in FIGS. 5A to 5E, a laminate member having the first metal layer 11A, the insulating layer 12A, and the second metal layer 13A is first prepared (FIG. 5A). Next, in patterning the second metal layer 13A, the reinforcing layer 2 is formed simultaneously with the wiring layer 13 to obtain the laminated body 20 (FIG. 5B). Thereafter, a circuit board is obtained in the same manner as FIGS. 4A to 4E except for not forming the reinforcing layer 2 out of a material of the cover layer 14 (FIGS. 5C to 5E).

Thus, according to the present invention, the formation of the shape retention unit allows a circuit board to be excellent in form stability.

The manufacturing method of a circuit board of the present invention is hereinafter described in each step.

1. Laminated Body Forming Step

First, the laminated body forming step in the present invention is described. The laminated body forming step in the present invention is a step of forming a laminated body comprising a first metal layer, an insulating layer formed on the above-mentioned first metal layer, and a reinforcing layer and a wiring layer formed on the above-mentioned insulating layer.

A forming method of the laminated body is not particularly limited as long as it is a method by which a desired laminated body can be obtained. Examples of the forming method of the laminated body include a method using a laminate member shown in FIGS. 4A and 5A. Also, in the present invention, the laminated body may be formed by an additive method.

The laminated body in the present invention may further have the cover layer for covering the wiring layer. Each member used for the laminated body is the same as that described in the above-mentioned 'A. Circuit board'; therefore, the description herein is omitted.

Also, in the present invention, as shown in FIGS. 4A to 4C, a preparing step of preparing a laminate member having a first metal layer, an insulating layer and a second metal layer; a wiring layer forming step of forming a wiring layer by wet-etching the above-mentioned second metal layer; and a cover layer/reinforcing layer simultaneously forming step of simultaneously forming a cover layer for covering the above-mentioned wiring layer and a reinforcing layer formed on the above-mentioned insulating layer in a portion for a second insulating layer, are preferably performed as preparing steps of the laminated body. The reason therefor is that the simultaneous formation of the cover layer and the reinforcing layer enables simplification of a manufacturing process.

Figure 6A:
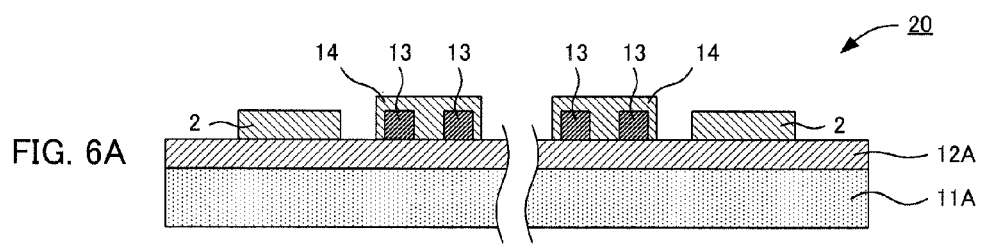
FIGS. 6A and 6B are each a schematic cross-sectional view exemplifying a laminated member in the present invention.
Figure 6B:
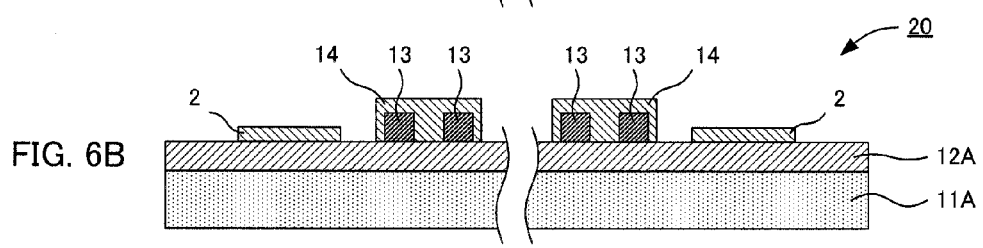

In addition, in the cover layer/reinforcing layer simultaneously forming step, the reinforcing layer and the cover layer are preferably formed so that the thickness of the reinforcing layer is thicker than the thickness of the cover layer on the wiring layer. The reason therefor is that the shape retention unit may be reinforced while enhancing weight reduction by thickening only the thickness of the reinforcing layer without thickening the thickness of the cover layer on the wiring layer more than necessary. Also, in order to create such a difference in thickness, for example, the viscosity of a resin (resin before ultraviolet curing or before heat curing) as a material of the cover layer and the reinforcing layer is preferably adjusted low. When a resin with a low viscosity is used, as shown in FIG. 6A, the resin flows out of the upper face of the wiring layer 13 in the patterned wiring layer 13. As a result, the thickness of the cover layer 14 on the wiring layer 13 is thinned by the amount in which the resin flew out. On the other hand, even in the case of using a resin with a low viscosity, the resin does not flow out in the unpatterned insulating layer 12A to give the thicker reinforcing layer 2. FIG. 6A is a cross-sectional view corresponding to the above-mentioned FIG. 4C. Meanwhile, when a resin with a high viscosity is used, as shown in FIG. 6B, a difference between the thickness of the cover layer 14 on the wiring layer 13 and the thickness of the reinforcing layer 2 is decreased.

2. Insulating Layer Etching Step

Next, the insulating layer etching step in the present invention is described. The insulating layer etching step in the present invention is a step of forming a second insulating layer for supporting the above-mentioned reinforcing layer and a first insulating layer for supporting the above-mentioned wiring layer by etching the insulating layer of the above-mentioned laminated body.

A method of etching the insulating layer is not particularly limited but specific examples thereof include wet etching. Kinds of an etching solution used for wet-etching are preferably selected properly in accordance with kinds of the insulating layer; for example, in the case where a material of the insulating layer is a polyimide resin, an alkali-based etching solution may be used.

Figure 7A:
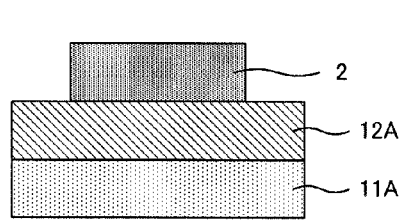
FIGS. 7A and 7B are each a schematic cross-sectional view explaining the insulating layer etching step in the present invention.

In the present invention, the reinforcing layer is preferably used as a resist layer in the insulating layer etching step. The reason therefor is that the reinforcing layer may be used as the resist layer and no resist layer needs to be separately provided. Specifically, as shown in FIG. 7A, the insulating layer 12A may be etched by using the reinforcing layer 2 formed on the insulating layer 12A as the resist layer. In this case, a material of the reinforcing layer is preferably a material with a lower etching rate than a material of the insulating layer. The reason therefor is that it is useful as the resist layer.

Figure 7B:
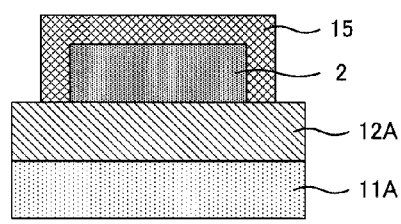

Also, in the present invention, the reinforcing layer may not be used as the resist layer. In this case, the resist layer needs to be separately provided so as to cover the reinforcing layer; however, there is the advantage that the range of material selection is widened since it is not necessary to consider an etching rate of a material of the reinforcing layer. Specific examples of the case of not using the reinforcing layer as the resist layer include the case of etching the insulating layer 12A by providing the resist layer (such as a DFR layer) for covering the reinforcing layer 2, as shown in FIG. 7B.

In the present invention, in the case where a material of the reinforcing layer is a polyimide resin, the reinforcing layer may be used as the resist layer, or the resist layer for covering the reinforcing layer may separately be provided. On the other hand, in the case where a material of the reinforcing layer is copper, ordinarily, the reinforcing layer is not etched by an etching solution for polyimide resin, so that the necessity of separately providing the resist layer is low. In the case where the laminated body comprises the cover layer for covering the wiring layer, the resist layer for protecting the cover layer may be provided as required in the insulating layer etching step.

Figure 8A:
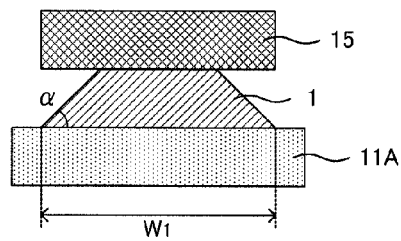
FIGS. 8A and 8B are each a schematic cross-sectional view explaining the insulating layer etching step in the present invention.

Also, a material of the reinforcing layer in the present invention is preferably a material with high adhesion properties to the insulating layer. The reason therefor is to allow the shape retention unit with a narrower width to be formed. Conventionally, when a solvent photoresist or an alkaline development peeling photoresist is used as the resist layer in etching the insulating layer, an alkali-based etching solution generally used particularly as an etching solution for polyimide resin occasionally dissolves the resist layer to deteriorate adhesion properties between the insulating layer and the resist layer. Thus, the etching solution permeates between the insulating layer and the resist layer, and the insulating layer in the permeated portion is etched, whereby a tapered shape of the insulating layer becomes so remarkable that it occasionally becomes difficult to narrow the width of the insulating layer. Specifically, as shown in FIG. 8A, in the case of using a conventional resist layer 15, a taper angle $\alpha$ at the bottom of the second insulating layer 1 to be obtained is decreased and the width $W_1$ of the second insulating layer 1 occasionally needs to be increased for saving the top portion of the second insulating layer 1.

Figure 8B:
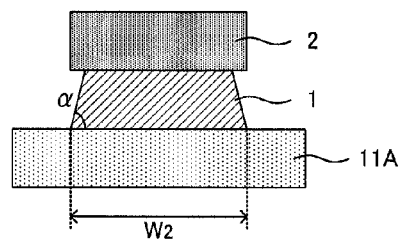

On the contrary, in the case where the reinforcing layer with higher adhesion properties to the insulating layer than a conventional resist layer is used as the resist layer, the etching solution permeates between the insulating layer and the reinforcing layer with such difficulty that the width of the insulating layer may be narrowed. Specifically, as shown in FIG. 8B, in the case of using the reinforcing layer 2 with high adhesion properties as the resist layer, a taper angle $\alpha$ at the bottom of the second insulating layer 1 to be obtained is increased and the width $W_2$ of the second insulating layer 1 may be decreased. The taper angle $\alpha$ is, for example, preferably 30° or more, more preferably 35° or more, far more preferably 60° or more, and particularly preferably 70° or more. The reason therefor is to allow the shape retention unit to be further thinned.

3. Metal Layer Etching Step

Next, the metal layer etching step in the present invention is described. The metal layer etching step in the present invention is a step of forming a metal supporting substrate having an open area by etching the above-mentioned first metal layer after the above-mentioned insulating layer etching step, and thereby forming a shape retention unit having the above-mentioned second insulating layer and the above-mentioned reinforcing layer, and bridging the above-mentioned metal supporting substrate divided by the above-mentioned open area.

A method of etching the first metal layer is not particularly limited but specific examples thereof include wet etching. Kinds of an etching solution used for wet-etching are preferably selected properly in accordance with kinds of the first metal layer; for example, in the case where a material of the first metal layer is SUS, an iron chloride-based etching solution may be used. Also, in the case where it is etched by the above-mentioned etching solution, another layer is preferably protected from the etching solution as required.

3. Other Steps

In the present invention, the removing step of removing the above-mentioned reinforcing layer may be performed after the metal layer etching step. For example, in the case where the reinforcing layer is a metal layer and mechanical strength of the shape retention unit becomes too strong, the reinforcing layer is removed to allow flexibility of the shape retention unit to be improved. Even in such a case, the shape retention unit (the second insulating layer) with a narrow width may be obtained.

C. Suspension Substrate

Next, a suspension substrate of the present invention is described. The suspension substrate of the present invention is characterized by being the above-mentioned circuit board.

According to the present invention, the use of the above-mentioned circuit board allows a suspension substrate to be excellent in form stability.

Figure 9:
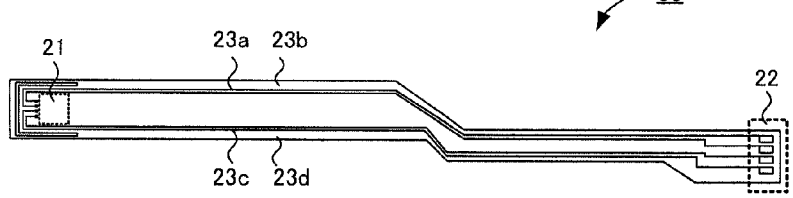
FIG. 9 is a schematic plan view showing an example of a suspension substrate of the present invention.

FIG. 9 is a schematic plan view showing an example of the suspension substrate of the present invention. The description of a cover layer is omitted for convenience. A suspension substrate 30 shown in FIG. 9 has, at one tip, a device mounting area 21 which is mounted with the device and has, at the other tip, a connecting area 22 for connecting with another circuit board. In addition, the suspension substrate 30 has a wiring layer 23 (wiring layers 23a to 23d) for connecting the device mounting area 21 and the connecting area 22. Each of the wiring layers 23a and 23b and the wiring layers 23c and 23d forms wiring pairs, respectively, one of which is for recording and the other of which is for regeneration.

Each member composing the suspension substrate of the present invention is the same as that described in the above-mentioned 'A. Circuit board'; therefore, the description herein is omitted.

D. Suspension

Next, a suspension of the present invention is described. The suspension of the present invention comprises the above-mentioned suspension substrate.

According to the present invention, the use of the above-mentioned suspension substrate allows a suspension to be excellent in form stability.

Figure 10:
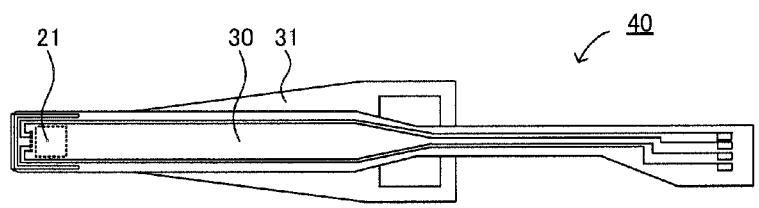
FIG. 10 is a schematic plan view showing an example of a suspension of the present invention.

FIG. 10 is a schematic plan view showing an example of the suspension of the present invention. A suspension 40 shown in FIG. 10 has the above-mentioned suspension substrate 30 and a load beam 31 provided on the surface of the suspension substrate 30 on the opposite side to the surface on which the device mounting area 21 is formed.

The suspension of the present invention has at least the suspension substrate and ordinarily has the load beam additionally. The suspension substrate is the same as that described in the above-mentioned 'C. Suspension substrate'; therefore, the description herein is omitted. The same load beam as is used for a general suspension may be used for the load beam.

E. Device-Mounted Suspension

Next, a device-mounted suspension of the present invention is described. The device-mounted suspension of the present invention comprises the above-mentioned suspension and a device mounted on a device mounting area of the above-mentioned suspension.

According to the present invention, the use of the above-mentioned suspension allows a suspension to be excellent in form stability.

Figure 11:
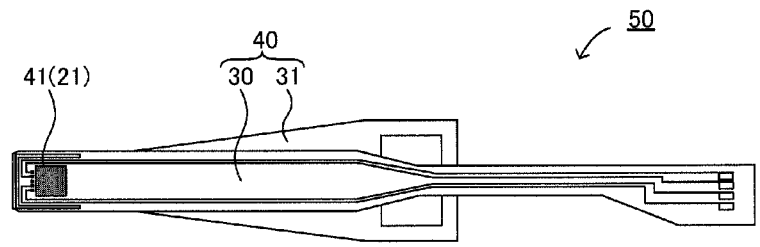
FIG. 11 is a schematic plan view showing an example of a device-mounted suspension of the present invention.

FIG. 11 is a schematic plan view showing an example of the device-mounted suspension of the present invention. A device-mounted suspension 50 shown in FIG. 11 has the above-mentioned suspension 40 and a device 41 mounted on the device mounting area 21 of the suspension 40.

The device-mounted suspension of the present invention has at least the suspension and the device. The suspension is the same as that described in the above-mentioned 'D. Suspension'; therefore, the description herein is omitted. Also, the device is the same as that described in the above-mentioned 'A. Circuit board'; therefore, the description herein is omitted.

F. Hard Disk Drive

Next, a hard disk drive of the present invention is described. The hard disk drive of the present invention comprises the above-mentioned device-mounted suspension.

According to the present invention, the use of the above-mentioned device-mounted suspension allows a highly functionalized hard disk drive.

Figure 12:
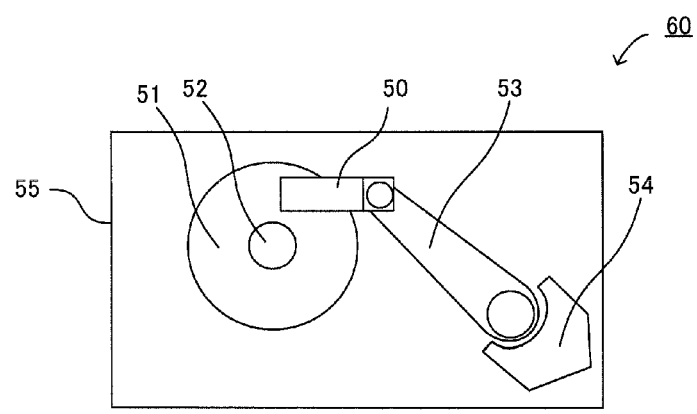
FIG. 12 is a schematic plan view showing an example of a hard disk drive of the present invention.

FIG. 12 is a schematic plan view showing an example of the hard disk drive of the present invention. A hard disk drive 60 shown in FIG. 12 comprises the above-mentioned device-mounted suspension 50, a disk 51 for which the device-mounted suspension 50 performs writing and reading of data, a spindle motor 52 for rotating the disk 51, an arm 53 and a voice coil motor 54 for moving the device of the device-mounted suspension 50, and a case 55 for sealing the above-mentioned members.

The hard disk drive of the present invention comprises at least the device-mounted suspension, and ordinarily comprises the disk, the spindle motor, the arm and the voice coil motor additionally. The device-mounted suspension is the same as that described in the above-mentioned 'E. Device-mounted suspension'; therefore, the description herein is omitted. Also, the same members as those used for a general hard disk drive may be used for other members.

The present invention is not limited to the above-mentioned embodiments. The above-mentioned embodiments are exemplifications, and any case is included in the technical scope of the present invention if it has substantially the same constitution as the technical idea described in the claims of the present invention and achieves similar operation effects thereto.

EXAMPLES

The present invention is hereinafter described more specifically using examples.

Example 1-1

First, a laminate member shown in FIG. 4A was prepared. Here, a first metal layer 11A is SUS304 with a thickness of 20 μm, an insulating layer 12A is a polyimide resin with a thickness of 10 μm, and a second metal layer 13A is electrolytic copper foil with a thickness of 12 μm. Next, as shown in FIGS. 4B to 4D, the etching of the second metal layer 13A, the formation of a cover layer 14 and a reinforcing layer 2, and the etching of the insulating layer 12A were performed. Here, the polyimide resin with a lower etching rate than a polyimide resin in the insulating layer 12A was used for the cover layer 14. Also, the width of a second insulating layer 1 was determined at 80 μm.

Next, in order to etch the first metal layer 11A, a resist layer was formed in a portion, for which the etching was not performed, using DFR. On this occasion, a resist layer was also formed on the surface of the reinforcing layer 2. Thereafter, as shown in FIG. 4E, the first metal layer 11A exposed from the resist layer was etched using an iron chloride-based etching solution. Lastly, the first metal layer 11A was treated by using an alkali-based peeling solution on the conditions of a flow rate of 1.2 liter/min. and a treating time of 40 sec. to peel off the resist layer and then obtain a circuit board. These peeling conditions were regarded as peeling conditions 1.

Examples 1-2 and 1-3

A circuit board was obtained in the same manner as Example 1-1 except for modifying the flow rate of the alkali-based peeling solution twice larger (Example 1-2). These peeling conditions were regarded as peeling conditions 2. Also, a circuit board was obtained in the same manner as Example 1-1 except for modifying the flow rate of the alkali-based peeling solution twice larger and modifying the treating time twice larger (Example 1-3). These peeling conditions were regarded as peeling conditions 3.

Examples 2-1 to 2-3, 3-1 to 3-3, 4-1 to 4-3, and 5-1 to 5-3

A circuit board was obtained in the same manner as Examples 1-1 to 1-3 except for modifying the line width of the second insulating layer 1 into 70 μm (Examples 2-1 to 2-3). Also, a circuit board was obtained in the same manner as Examples 1-1 to 1-3 except for modifying the line width of the second insulating layer 1 into 60 μm (Examples 3-1 to 3-3). Also, a circuit board was obtained in the same manner as Examples 1-1 to 1-3 except for modifying the line width of the second insulating layer 1 into 50 μm (Examples 4-1 to 4-3). Also, a circuit board was obtained in the same manner as Examples 1-1 to 1-3 except for modifying the line width of the second insulating layer 1 into 40 μm (Examples 5-1 to 5-3).

Comparative Examples 1-1 to 1-3

A circuit board was obtained in the same manner as Examples 1-1 to 1-3 except for not forming the reinforcing layer 2. This circuit board comprises a shape retention unit 10 composed of only the second insulating layer 2.

Comparative Examples 2-1 to 2-3, 3-1 to 3-3, 4-1 to 4-3, and 5-1 to 5-3

A circuit board was obtained in the same manner as Comparative Examples 1-1 to 1-3 except for modifying the line width of the second insulating layer 1 into 70 μm (Comparative Examples 2-1 to 2-3). Also, a circuit board was obtained in the same manner as Comparative Examples 1-1 to 1-3 except for modifying the line width of the second insulating layer 1 into 60 μm (Comparative Examples 3-1 to 3-3). Also, a circuit board was obtained in the same manner as Comparative Examples 1-1 to 1-3 except for modifying the line width of the second insulating layer 1 into 50 μm (Comparative Examples 4-1 to 4-3). Also, a circuit board was obtained in the same manner as Comparative Examples 1-1 to 1-3 except for modifying the line width of the second insulating layer 1 into 40 μm (Comparative Examples 5-1 to 5-3).

[Evaluation 1]

The circuit boards obtained in the above-mentioned Examples and Comparative Examples were observed with a stereoscopic microscope of fifty magnifications, and they were confirmed whether creases were caused in the shape retention unit 10 in the boundary between the open area and the metal supporting substrate to evaluate the incidence rate thereof. The results are shown in Table 1.

TABLE 1

| | WIDTH OF SECOND INSULATING LAYER (μm) | PEELING CONDITIONS | INCIDENCE RATE OF CREASES |
|---|---|---|---|
| EXAMPLE 1-1 | 80 | 1 | 0% |
| EXAMPLE 1-2 | 80 | 2 | 0% |
| EXAMPLE 1-3 | 80 | 3 | 0% |
| EXAMPLE 2-1 | 70 | 1 | 0% |
| EXAMPLE 2-2 | 70 | 2 | 0% |
| EXAMPLE 2-3 | 70 | 3 | 0% |
| EXAMPLE 3-1 | 60 | 1 | 0% |
| EXAMPLE 3-2 | 60 | 2 | 0% |
| EXAMPLE 3-3 | 60 | 3 | 0% |
| EXAMPLE 4-1 | 50 | 1 | 0% |
| EXAMPLE 4-2 | 50 | 2 | 0% |
| EXAMPLE 4-3 | 50 | 3 | 0% |
| EXAMPLE 5-1 | 40 | 1 | 0% |
| EXAMPLE 5-2 | 40 | 2 | 0% |
| EXAMPLE 5-3 | 40 | 3 | 0% |
| COMPARATIVE EXAMPLE 1-1 | 80 | 1 | 1% |
| COMPARATIVE EXAMPLE 1-2 | 80 | 2 | 5% |
| COMPARATIVE EXAMPLE 1-3 | 80 | 3 | 10% |
| COMPARATIVE EXAMPLE 2-1 | 70 | 1 | 3% |
| COMPARATIVE EXAMPLE 2-2 | 70 | 2 | 10% |
| COMPARATIVE EXAMPLE 2-3 | 70 | 3 | 50% OR MORE |
| COMPARATIVE EXAMPLE 3-1 | 60 | 1 | 10% |
| COMPARATIVE EXAMPLE 3-2 | 60 | 2 | 25% |
| COMPARATIVE EXAMPLE 3-3 | 60 | 3 | 50% OR MORE |
| COMPARATIVE EXAMPLE 4-1 | 50 | 1 | — |
| COMPARATIVE EXAMPLE 4-2 | 50 | 2 | — |
| COMPARATIVE EXAMPLE 4-3 | 50 | 3 | — |
| COMPARATIVE EXAMPLE 5-1 | 40 | 1 | — |
| COMPARATIVE EXAMPLE 5-2 | 40 | 2 | — |
| COMPARATIVE EXAMPLE 5-3 | 40 | 3 | — |

As shown in Table 1, in any of Examples, the incidence rate of creases was 0% and creases were prevented from occurring in the shape retention unit in peeling off DER. On the contrary, in Comparative Examples, the smaller width of the second insulating layer, the higher the incidence rate of creases. In particular, in Comparative Examples 4-1 to 4-3 and 5-1 to 5-3, the top portion of the second insulating layer was lost and the incidence rate of creases could not be measured. Also, in Comparative Examples, it was confirmed that the stricter peeling conditions, the higher the incidence rate of creases.

In the above-mentioned Examples and Comparative Examples, in the step of etching the first metal layer 11A, in order to remove the metal layer for supporting the shape retention unit, the shape retention unit is easily subjected to stress particularly in the boundary between the open area and the metal supporting substrate. On the other hand, in peeling off the resist layer, when the resist layer is swollen by the alkali-based solution, stress is applied to the above-mentioned boundary. Even in the case where such stress was applied, it is conceived that the reinforcing layer reinforced the second insulating layer in the above-mentioned Examples and thereby deformation (creases) was not caused in the shape retention unit. On the contrary, it is conceived that since the reinforcing layer was not used in the above-mentioned Comparative Examples, the shape retention unit was subjected to stress when swollen, and deformation (creases) was caused therein.

Example 6-1

A circuit board was obtained by the same method as Example 1-1.

Example 6-2

First, a laminate member shown in FIG. 5A was prepared. Here, a first metal layer 11A is SUS304 with a thickness of 20 μm, an insulating layer 12A is a polyimide resin with a thickness of 10 μm, and a second metal layer 13A is an electrolytic copper foil with a thickness of 12 μm. Next, as shown in FIGS. 5B to 5D, the formation of a wiring layer 13 and a reinforcing layer 2, the formation of a cover layer 14, and the etching of the insulating layer 12A were performed. Here, a polyimide resin was used for the cover layer 14. Also, the width of a second insulating layer 1 was determined at 80 μm. Thereafter, the etching of the first metal layer 11A and the peeling of a resist layer were performed in the same manner as Example 1-1.

Comparative Example 6

A circuit board was obtained by the same method as Comparative Example 1-1.

[Evaluation 2]

The circuit boards obtained in Examples 6-1 and 6-2 and Comparative Example 6 were observed by SEM to measure a taper angle at the bottom of the second insulating layer. As a result, the taper angle was 35° in Example 6-1 and the taper angle was 70° in Example 6-2. On the contrary, the taper angle was 25° in Comparative Example 6. Thus, the etching solution permeated between the insulating layer and the reinforcing layer with such difficulty by providing the reinforcing layer with high adhesion properties to the insulating layer that the second insulating layer having a high taper angle could be obtained, whereby it was confirmed that the reinforcing layer was useful for thinning the second insulating layer.

Example 7

A laminate member shown in FIG. 4A was prepared. Here, a first metal layer 11A is SUS304 with a thickness of 20 μm, an insulating layer 12A is a polyimide resin with a thickness of 10 μm, and a second metal layer 13A is electrolytic copper foil with a thickness of 9 μm. Next, as shown in FIGS. 4B to 4D, the etching of the second metal layer 13A, the formation of a cover layer 14 and a reinforcing layer 2, and the etching of the insulating layer 12A were performed. Here, a polyimide resin with a lower etching rate than a polyimide resin in the insulating layer 12A was used for the cover layer 14. Also, the width of a second insulating layer 1 was determined at 80 μm. The reinforcing layer 2 was formed out of the same material as the cover layer 14, and in forming the cover layer 14, varnish of non-photosensitive polyimide was adjusted to appropriate viscosity and applied so as to obtain a laminated body 20 shown in FIG. 6A. The thickness of the imidized reinforcing layer 2 was 6 μm and the thickness of the cover layer 14 on a wiring layer 13 was 4 μm. Thereafter, a circuit board was obtained in the same manner as Example 1-1. Thus, there was obtained a circuit board such that the thickness of the reinforcing layer was thicker than the thickness of the cover layer on the wiring layer.

Example 8

A laminate member shown in FIG. 5A was prepared. Here, a first metal layer 11A is SUS304 with a thickness of 20 μm, an insulating layer 12A is a polyimide resin with a thickness of 10 μm, and a second metal layer 13A is electrolytic copper foil with a thickness of 9 μm. A circuit board was obtained in the same manner as Example 6-2 except for using such a laminate member.

REFERENCE SIGNS LIST 1 second insulating layer
2 reinforcing layer
10 shape retention unit
11 metal supporting substrate
11A first metal layer
12 first insulating layer
12A insulating layer
13 wiring layer
13A second metal layer
14 cover layer
20 laminated body
X open area
M device mounting area

The invention claimed is:

1. A circuit board comprising a metal supporting substrate, a first insulating layer formed on the metal supporting substrate, and a wiring layer formed on the first insulating layer, wherein an open area is formed in the metal supporting substrate, and the circuit board comprises a shape retention unit having a second insulating layer contacting with the metal supporting substrate and a reinforcing layer formed on the second insulating layer, and bridging the metal supporting substrate divided by the open area, and the shape retention unit is electrically separated and optically separated from outside; wherein the metal supporting substrate divided by the open area is a movable area being movable in a thickness direction of the circuit board.

2. The circuit board according to claim 1, wherein a material of the second insulating layer is the same as a material of the first insulating layer.

3. The circuit board according to claim 1, wherein a material of the second insulating layer is a polyimide resin.

4. The circuit board according to claim 1, further comprising a cover layer for covering the wiring layer.

5. The circuit board according to claim 1, wherein a material of the reinforcing layer is a polyimide resin.

6. The circuit board according to claim 1, wherein a material of the reinforcing layer is the same as a material of the wiring layer.

7. The circuit board according to claim 1, wherein a material of the reinforcing layer is copper.

8. The circuit board according to claim 1, wherein the reinforcing layer is formed on the whole surface of the second insulating layer.

9. A suspension substrate which is the circuit board according to claim 1.

10. The circuit board according to claim 4, wherein a material of the reinforcing layer is the same as a material of the cover layer.

11. A suspension comprising the suspension substrate according to claim 9.

12. The circuit board according to claim 10, wherein a thickness of the reinforcing layer is thicker than a thickness of the cover layer on the wiring layer.

13. A device mounted suspension comprising the suspension according to claim 11 and a device mounted on a device mounting area of the suspension.

14. A hard disk drive comprising the device-mounted suspension according to claim 13.

15. A manufacturing method of a circuit board, comprising steps of: a laminated body forming step of forming a laminated body comprising a first metal layer, an insulating layer formed on the first metal layer, and a reinforcing layer and a wiring layer formed on the insulating layer; an insulating layer etching step of forming a second insulating layer for supporting the reinforcing layer and a first insulating layer for supporting the wiring layer by etching the insulating layer of the laminated body; and a metal layer etching step of forming a metal supporting substrate having an open area by etching the first metal layer after the insulating layer etching step, and thereby forming a shape retention unit having the second insulating layer and the reinforcing layer, and bridging the metal supporting substrate divided by the open area, and the shape retention unit is electrically separated and optically separated from the outside; and wherein the metal layer divided by the open area is a movable area being movable in a thickness direction of the circuit board.

16. The manufacturing method of a circuit board according to claim 15, wherein the reinforcing layer is used as a resist layer in the insulating layer etching step.

17. The manufacturing method of a circuit board according to claim 15, wherein a material of the reinforcing layer is a material with a lower etching rate than a material of the insulating layer.

18. The manufacturing method of a circuit board according to claim 15, wherein a material of the reinforcing layer is a polyimide resin or copper.

19. The manufacturing method of a circuit board according to claim 15, wherein a material of the insulating layer is a polyimide resin.

* * * * *